United States Patent
Sun

(10) Patent No.: US 11,282,980 B2
(45) Date of Patent: Mar. 22, 2022

(54) METHOD OF FABRICATING A MICRO LIGHT EMITTING DIODE DISPLAY SUBSTRATE, AND MICRO LIGHT EMITTING DIODE DISPLAY SUBSTRATE

(71) Applicant: BOE Technology Group Co., Ltd., Beijing (CN)

(72) Inventor: Shuang Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 400 days.

(21) Appl. No.: 16/468,086

(22) PCT Filed: Nov. 26, 2018

(86) PCT No.: PCT/CN2018/117428
§ 371 (c)(1),
(2) Date: Jun. 10, 2019

(87) PCT Pub. No.: WO2020/006972
PCT Pub. Date: Jan. 9, 2020

(65) Prior Publication Data
US 2021/0336074 A1 Oct. 28, 2021

(30) Foreign Application Priority Data
Jul. 5, 2018 (CN) .......................... 201810730303.7

(51) Int. Cl.
*H01L 33/00* (2010.01)
*H01L 25/075* (2006.01)
(Continued)

(52) U.S. Cl.
CPC ...... *H01L 33/0075* (2013.01); *H01L 25/0753* (2013.01); *H01L 25/167* (2013.01);
(Continued)

(58) Field of Classification Search
CPC ............ H01L 33/0075; H01L 25/0753; H01L 25/167; H01L 33/0093; H01L 33/0095;
(Continued)

(56) References Cited

U.S. PATENT DOCUMENTS

| 2012/0132917 A1* | 5/2012 | Lee | .................... H01L 27/1218 257/59 |
|---|---|---|---|
| 2013/0126081 A1 | 5/2013 | Hung-Fai et al. | |

(Continued)

FOREIGN PATENT DOCUMENTS

| CN | 104362236 A | 2/2015 |
|---|---|---|
| CN | 104409605 A | 3/2015 |

(Continued)

OTHER PUBLICATIONS

Second Office Action in the Chinese Patent Application No. 201810730303.7, dated Jul. 24, 2020; English translation attached.

(Continued)

*Primary Examiner* — Su C Kim
(74) *Attorney, Agent, or Firm* — Intellectual Valley Law, P.C.

(57) ABSTRACT

A method of fabricating a micro light emitting diode (micro LED) display substrate. The method includes forming a definition layer on a growth substrate for defining a plurality of subpixel areas, the definition layer formed to include a plurality of lateral walls, each of the plurality of subpixel areas surrounded by a respective one of the plurality of lateral walls; forming a plurality of semiconductor layers of a plurality of micro LEDs on the growth substrate in the plurality of subpixel areas defined by the definition layer; transferring the plurality of semiconductor layers of the plurality of micro LEDs on the growth substrate onto a target substrate; and removing the growth substrate from the
(Continued)

plurality of semiconductor layers of the plurality of micro LEDs transferred onto the target substrate.

17 Claims, 7 Drawing Sheets

(51) Int. Cl.
*H01L 25/16* (2006.01)
*H01L 33/44* (2010.01)

(52) U.S. Cl.
CPC ...... *H01L 33/0093* (2020.05); *H01L 33/0095* (2013.01); *H01L 33/44* (2013.01); *H01L 2933/0025* (2013.01)

(58) Field of Classification Search
CPC H01L 33/44; H01L 2933/0025; H01L 27/156
See application file for complete search history.

(56) References Cited

U.S. PATENT DOCUMENTS

| | | | |
|---|---|---|---|
| 2014/0117392 A1* | 5/2014 | Kim | ...................... H01L 33/007 257/98 |
| 2014/0267683 A1* | 9/2014 | Bibl | ...................... H01L 27/156 348/87 |
| 2018/0219123 A1 | 8/2018 | Wang et al. | |

FOREIGN PATENT DOCUMENTS

| | | |
|---|---|---|
| CN | 105870265 A | 8/2016 |
| CN | 107833878 A | 3/2018 |

OTHER PUBLICATIONS

First Office Action in the Chinese Patent Application No. 201810730303.7, dated Mar. 16, 2020; English translation attached.

* cited by examiner

METHOD OF FABRICATING A MICRO LIGHT EMITTING DIODE DISPLAY SUBSTRATE, AND MICRO LIGHT EMITTING DIODE DISPLAY SUBSTRATE

CROSS-REFERENCE TO RELATED APPLICATION

This application is a national stage application under 35 U.S.C. § 371 of International Application No. PCT/CN2018/117428, filed Nov. 26, 2018, which claims priority to Chinese Patent Application No. 201810730303.7, filed Jul. 5, 2018, the contents of which are incorporated by reference in the entirety.

TECHNICAL FIELD

The present invention relates to display technology, more particularly, to a method of fabricating a micro light emitting diode display substrate, and a micro light emitting diode display substrate.

BACKGROUND

The micro light emitting diode (micro LED) display technology refers to the technology of arraying and miniaturizing the conventional light emitting diodes on a substrate to form micro LEDs with ultra-small distances between two adjacent LEDs. Specifically, the size of light emitting diodes are miniaturized from a millimeter-level to a micron level, so that the micro LEDs can provide a display panel with ultra-high resolution. The micro LED display panel has many advantages including high resolution, long service life, low energy consumption.

SUMMARY

In one aspect, the present invention provides a method of fabricating a micro light emitting diode (micro LED) display substrate, comprising forming a definition layer on a growth substrate for defining a plurality of subpixel areas, the definition layer formed to comprise a plurality of lateral walls, each of the plurality of subpixel areas surrounded by a respective one of the plurality of lateral walls; forming a plurality of semiconductor layers of a plurality of micro LEDs on the growth substrate in the plurality of subpixel areas defined by the definition layer; transferring the plurality of semiconductor layers of the plurality of micro LEDs on the growth substrate onto a target substrate; and removing the growth substrate from the plurality of semiconductor layers of the plurality of micro LEDs transferred onto the target substrate.

Optionally, forming the definition layer comprises forming a sacrificial layer on the growth substrate, the sacrificial layer formed to comprise a plurality of protrusions on the growth substrate; wherein each of the plurality of protrusions is formed to have a top side away from the growth substrate and a lateral side surrounding a perimeter of a respective one of the plurality of protrusions; and adjacent protrusions of the plurality of protrusions are spaced apart by a groove having a bottom side exposing a surface of the growth substrate.

Optionally, the sacrificial layer is formed using a material comprising a semiconductor material selected from a group consisting of a group III semiconductor material, a group IV semiconductor material, and a group V semiconductor material.

Optionally, forming the definition layer further comprises depositing a precursor material on the growth substrate having the plurality of protrusions of the sacrificial layer to form a precursor material layer covering the lateral side of each of the plurality of protrusions; and removing the plurality of protrusions of the sacrificial layer.

Optionally, the precursor material layer is formed to cover the top side and the lateral side of each of the plurality of protrusions, and the bottom side of the groove; and forming the definition layer further comprises removing at least a portion of the precursor material layer on the top side of each of the plurality of protrusions.

Optionally, removing the at least the portion of the precursor material layer on the top side of each of the plurality of protrusions is performed by mechanical grinding.

Optionally, the precursor material comprises a metal.

Optionally, subsequent to removing the plurality of protrusions of the sacrificial layer, the method further comprises converting a remaining portion of the precursor material layer into an insulating material, thereby forming the definition layer; wherein forming the plurality of semiconductor layers on the growth substrate is performed subsequent to converting the remaining portion of the precursor material layer.

Optionally, converting the remaining portion of the precursor material layer into the insulating material is performed by an annealing oxidation process.

Optionally, the definition layer comprises alumina.

Optionally, forming the definition layer further comprises depositing an insulating material on the growth substrate having the plurality of protrusions of the sacrificial layer, the insulating material deposited to cover the lateral side of each of the plurality of protrusions, thereby forming an insulating material layer; removing the plurality of protrusions of the sacrificial layer; wherein forming the plurality of semiconductor layers on the growth substrate is performed subsequent to removing the plurality of protrusions of the sacrificial layer.

Optionally, the insulating material is deposited to cover the top side and the lateral side of each of the plurality of protrusions, and the bottom side of the groove; and forming the definition layer further comprises removing at least a portion of the insulating material layer on the top side of each of the plurality of protrusions, thereby forming the definition layer.

Optionally, the definition layer is formed to further comprise a bottom wall connecting the plurality of lateral walls, the bottom wall being in direct contact with the growth substrate; and the method further comprises removing the bottom wall subsequent to or simultaneously with removing the growth substrate.

Optionally, forming the plurality of semiconductor layers on the growth substrate comprises forming a plurality of semiconductor material layers on the growth substrate in the plurality of subpixel areas and in an area between adjacent subpixel areas of the plurality of subpixel areas; and removing semiconductor materials in the area between adjacent subpixel areas of the plurality of subpixel areas, thereby forming the plurality of semiconductor layers.

In another aspect, the present invention provides a micro light emitting diode (micro LED) display substrate, comprising a base substrate; a pixel definition layer on the bases substrate and defining a plurality of subpixel areas, the pixel definition layer comprising a plurality of lateral walls, each of the plurality of subpixel areas surrounded by a respective one of the plurality of lateral walls; and a plurality of micro LEDs respectively in the plurality of subpixel areas defined by the pixel definition layer; wherein each of the plurality of micro LEDs comprises a plurality of semiconductor layers; and at least one of the plurality of semiconductor layers in each individual one of the plurality of micro LEDs is surrounded by and in direct contact with a respectively one of the plurality of lateral walls.

Optionally, the pixel definition layer comprises an insulating material.

Optionally, the pixel definition layer comprises an insulating metal oxide material.

Optionally, the pixel definition layer comprises alumina.

In another aspect, the present invention provides a micro light emitting diode (micro LED) display apparatus, comprising the micro LED display substrate described herein or fabricated by a method described herein, and one or more integrated circuits connected to the micro LED display substrate.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
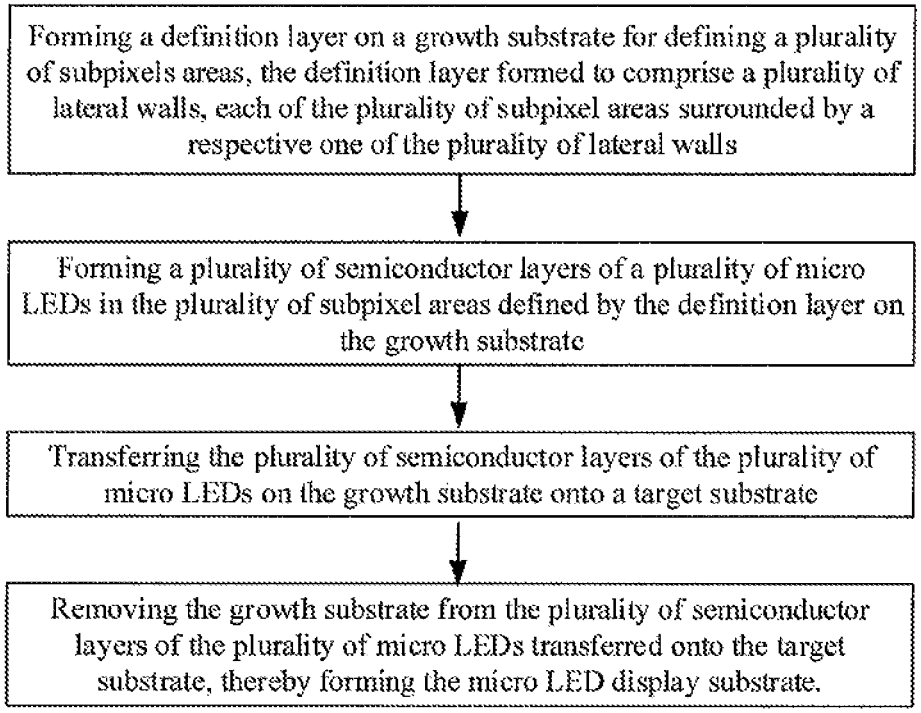
FIG. 1 is a flow chat illustrating a method of fabricating a micro LED display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In present, the micro LEDs have low luminous efficiency, which may further affect the display brightness of a display panel using micro LEDs. The reason leads to the low luminous efficiency of the micro LEDs is the gradually decreasing size of the micro LEDs. For example, the micro LEDs are formed by arraying and miniaturizing conventional light emitting diodes. In order to arraying and miniaturizing the conventional light emitting diodes, an etching process is performed on the conventional light emitting diodes. Sometimes, the micro LEDs are directly formed on a growth substrate. During the process of forming the micro LEDs on the growth substrate, the semiconductor materials (e.g. GaN of the epitaxial layer or the semiconductor layer) used to form the micro LEDs is too stable to be etched using wet etching process. Instead, the dry etching process has to be performed to array and miniaturize the conventional light emitting diodes. However, the dry etching process may damage the lateral walls of the micro LEDs, causing lateral-wall defects and forming leakage path, which may lead to the current leakage of the micro LEDs and affects the luminous efficiency of the micro LEDs. As the sizes of the micro LEDs become smaller, more leakage paths may be formed during the etching process, and the current leakage of the micro LEDs may increase, the luminous efficiency of the micro LEDs is thereby seriously degraded.

After the etching process, the follow up processes, such as magnetron sputtering, laser stripping, will further damage the exposed lateral walls of the epitaxial layer. The damage will further affect the performance of the micro LEDs, and the brightness of the display panel having micro LEDs.

Accordingly, the present disclosure provides, inter alia, a method of fabricating a micro light emitting diode display substrate, and a micro light emitting diode display substrate that substantially obviate one or more of the problems due to limitations and disadvantages of the related art. In one aspect, the present disclosure provides a method of fabricating a micro light emitting diode (micro LED) display substrate. The method includes forming a definition layer on a growth substrate for defining a plurality of subpixel areas, the definition layer formed to include a plurality of lateral walls, each of the plurality of subpixel areas surrounded by a respective one of the plurality of lateral walls; forming a plurality of semiconductor layers of a plurality of micro LEDs in the plurality of subpixel areas defined by the definition layer on the growth substrate; transferring the plurality of semiconductor layers of the plurality of micro LEDs on the growth substrate onto a target substrate; and removing the growth substrate from the plurality of semiconductor layers of the plurality of micro LEDs transferred onto the target substrate, thereby forming the micro LED display substrate. In the present method, a definition layer is first formed to define a plurality of subpixel areas. Subsequently, a plurality of micro LEDs can be formed respectively in the plurality of subpixel areas defined by the definition layer. The present method obviates an etching process to be performed on the semiconductor layers, avoiding the current leakage problem due to the damages of the lateral walls of the micro LEDs. The micro LED display panel can have a relatively high luminance efficiency while keeping the micro LEDs having a relatively small size, thereby increasing display resolution.

FIG. 1 is a flow chat illustrating a method of fabricating a micro LED display substrate in some embodiments according to the present disclosure. Referring to FIG. 1, the method of fabricating a micro LED display substrate includes forming a definition layer on a growth substrate for defining a plurality of subpixel areas. Optionally, the definition layer is formed to include a plurality of lateral walls, each of the plurality of subpixel areas surrounded by a respective one of the plurality of lateral walls. The method of fabricating a micro LED display substrate further includes forming a plurality of semiconductor layers of a plurality of micro LEDs in the plurality of subpixel areas defined by the definition layer on the growth substrate; transferring the plurality of semiconductor layers of the plurality of micro LEDs on the growth substrate onto a target substrate; and removing the growth substrate from the plurality of semiconductor layers of the plurality of micro LEDs transferred onto the target substrate, thereby forming the micro LED display substrate.

Figure 2:
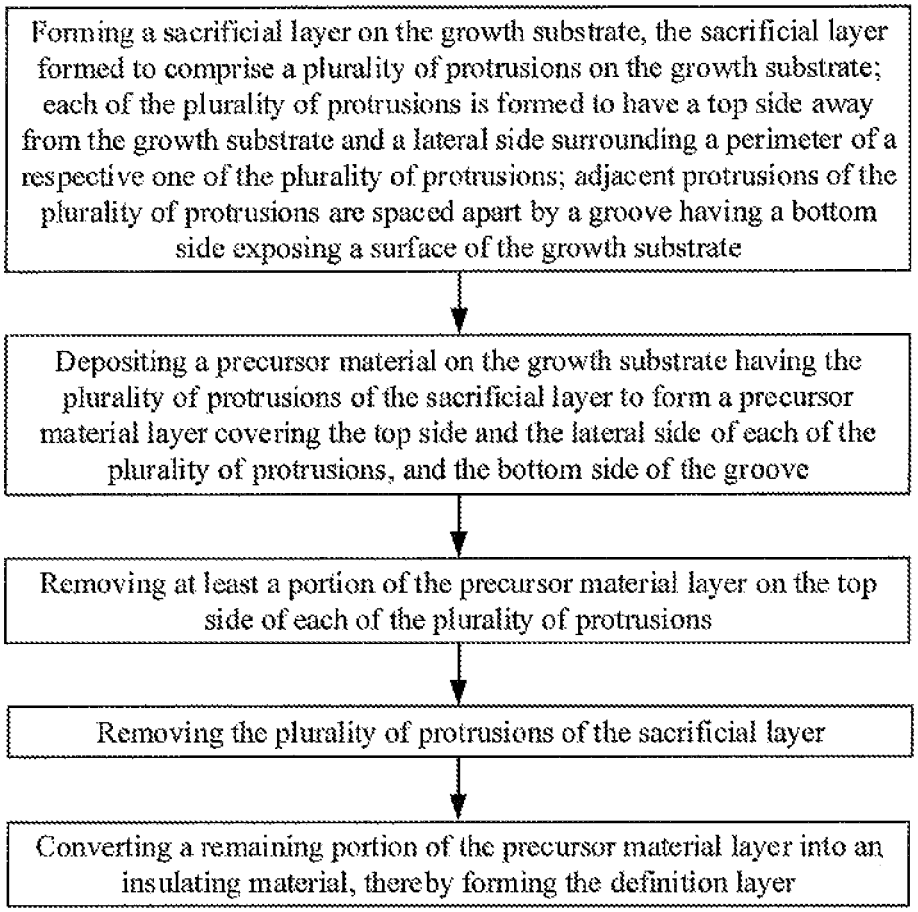
FIG. 2 is a flow chat illustrating a method of fabricating a micro LED display substrate in some embodiments according to the present disclosure.

FIG. 2 is a flow chat illustrating a method of fabricating a micro LED display substrate in some embodiments according to the present disclosure. Referring to FIG. 2, in some embodiments, forming the definition layer on the growth substrate includes forming a sacrificial layer on the growth substrate. Optionally, the sacrificial layer is formed to include a plurality of protrusions on the growth substrate. Each of the plurality of protrusions is formed to have a top side away from the growth substrate and a lateral side surrounding a perimeter of a respective one of the plurality of protrusions. Adjacent protrusions of the plurality of protrusions are spaced apart by a groove having a bottom side exposing a surface of the growth substrate. In some embodiments, subsequent to forming the sacrificial layer, a precursor material is deposited on the growth substrate having the plurality of protrusions of the sacrificial layer to form a precursor material layer. Optionally, the precursor material layer covers the top side and the lateral side of each of the plurality of protrusions, and the bottom side of the groove. Subsequent to forming a precursor material layer, at least a portion of the precursor material layer is removed on the top side of each of the plurality of protrusions. Subsequently, the plurality of protrusions of the sacrificial layer are removed. In some embodiments, subsequent to removing the plurality of protrusions of the sacrificial layer, a remaining portion of the precursor material layer is converted into an insulating material, thereby forming the definition layer.

Figure 3:
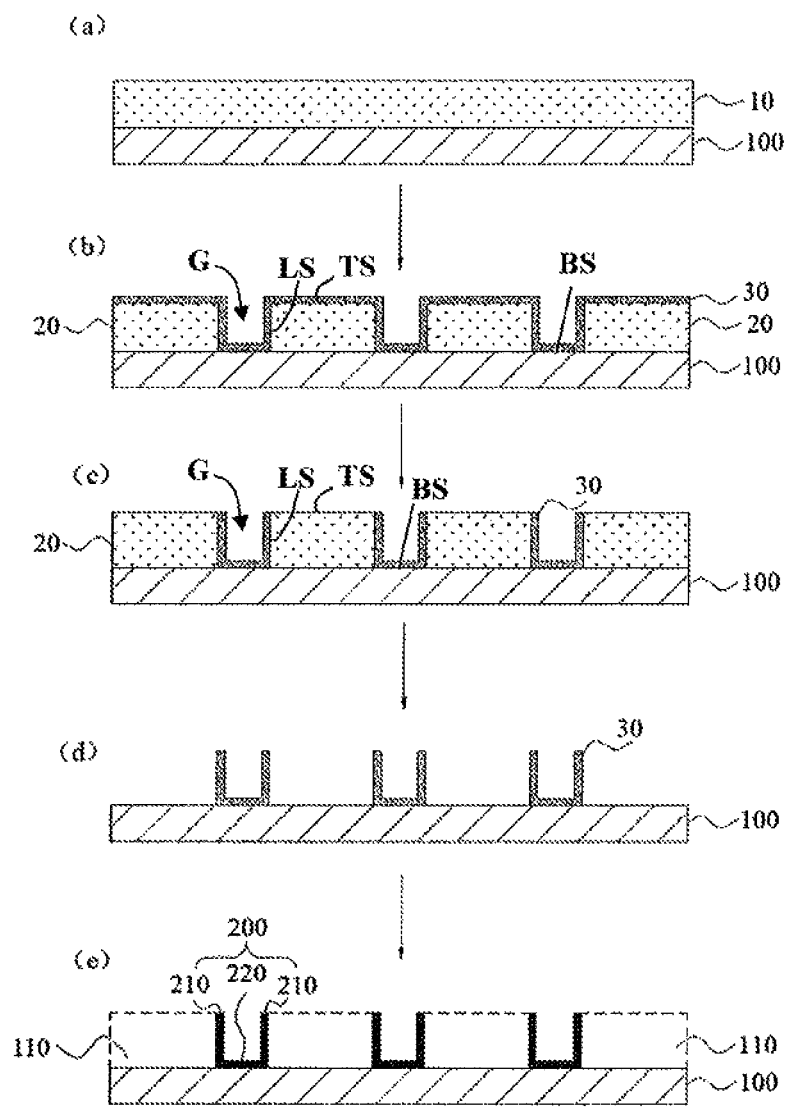
FIG. 3 illustrates a method of fabricating a micro LED display substrate in some embodiments according to the present disclosure.

FIG. 3 illustrates a method of fabricating a micro LED display substrate in some embodiments according to the present disclosure. Referring to FIG. 3(a), forming the definition layer on the growth substrate 100 includes forming a sacrificial layer 10 on a side of the growth substrate 100. Referring to FIG. 3(b), subsequent to forming the sacrificial layer 10, a patterning process is performed on the sacrificial layer 10 to form a plurality of protrusions 20. Optionally, each of the plurality of protrusions 20 is formed to have a top side TS away from the growth substrate 100 and a lateral side LS surrounding a perimeter of a respective one of the plurality of protrusions 20. Optionally, adjacent protrusions of the plurality of protrusions 20 are spaced apart by a groove G having a bottom side BS exposing a surface of the growth substrate 100.

Various appropriate methods may be used for patterning the sacrificial layer 10. Examples of methods suitable for patterning the sacrificial layer 10 include, not limited to, etching. Optionally, the pattern process is wet etching process.

Various appropriate materials may be used for making the sacrificial layer 10. Examples of materials suitable for making the sacrificial layer 10 include, but not limited to, materials having good solubility. In some embodiments, the material for making the sacrificial layer 10 is a material having a relatively high etching selectivity with respect to the other layers of the display substrate. Optionally, the sacrificial layer 10 is formed with a material including a semiconductor material selected from a group consisting of a group III semiconductor material, a group IV semiconductor material, and a group V semiconductor material. The appropriate materials used for making the sacrificial layer 10 should be removed easily, so the plurality of protrusions 20 can be easily removed to form the plurality of subpixel areas.

Referring to FIG. 3(b), in some embodiments, forming the definition layer further includes depositing a precursor material on the growth substrate 100 having the plurality of protrusions 20 of the sacrificial layer 10 to form a precursor material layer 30 covering the top side TS and the lateral side LS of each of the plurality of protrusions 20, and the bottom side BS of the groove G.

Various appropriate precursor materials may be used for making the precursor material layer. Examples of materials suitable for making the precursor material layer 30 include, but not limited to, metals. Optionally, the precursor material layer 30 may be formed by Aluminum (Al). The appropriate precursor materials may be selected to simplify the process. For example, a precursor material is a material that can be converted into an insulating material using a simple method (e.g. an annealing oxidation process).

Referring to FIG. 3(c), in some embodiments, forming the definition layer further includes removing at least a portion of the precursor material layer 30 on the top side TS of each of the plurality of protrusions 20. For example, the portion of the precursor material on the top side TS of each of the plurality of protrusions 20 is removed to obtain a remaining portion of the precursor material layer 30 covering the lateral side LS of each of the plurality of protrusions 20 and the bottom side BS of the groove.

Various appropriate methods may be used for removing at least a portion of the precursor material layer 30. Examples of methods suitable for removing at least a portion of the precursor material layer 30 include, but not limited to, mechanical grinding. Removing the precursor material layer 30 can be a simple process with a low cost.

Referring to FIG. 3(d), in some embodiments, forming the definition layer further includes removing the plurality of protrusions 20 of the sacrificial layer 10. Various appropriate methods may be used for removing the plurality of protrusions 20. Examples of method suitable for removing the plurality of protrusions 20 include, but not limited to, dissolving the materials having good solubility. For example, the methods for removing the plurality of protrusions 20 includes dissolving the semiconductor material selected from a group consisting of a group III semiconductor material, a group IV semiconductor material, and a group V semiconductor material. Remove the plurality of protrusions 20 can be performed in a simple process with a low cost.

Referring to FIG. 3(e), in some embodiments, forming the definition layer further includes converting the remaining portion of the precursor material layer 30 into an insulating material, thereby forming the definition layer 200. Optionally, converting the remaining portion of the precursor material layer 30 into the insulating material is performed by an annealing oxidation process. For example, the precursor material layer is formed by Aluminum (Al), the Aluminum (Al) is converted into Alumina using an annealing oxidation process. And the alumina formed is an insulating material.

In some embodiments, subsequent to converting the remaining portion of the precursor material layer 30 into the insulating material, the definition layer 200 is formed on a side of the growth substrate 100 for defining a plurality of subpixel areas 110. The definition layer 200 includes a plurality of lateral walls 210 and a bottom wall 220. Optionally, the plurality of lateral walls 210 are perpendicular to the growth substrate 100. Optionally, each of the plurality of subpixel areas 110 is surrounded by a respective one of the plurality of lateral walls 210. Optionally, the plurality of subpixel areas 110 are arranged in array. In one example, the definition layer 200 may define the size of the micro LEDs, and the definition layer 200 can protect the lateral walls of the plurality of semiconductor layers of the micro LEDs from being damaged by etching process, preventing formation of leakage paths on the lateral walls of the plurality of semiconductor layers and improving the display quality of the micro LEDs. The widths of the micro LEDs formed are in a range of approximately 1 μm to approximately 1000 μm, e.g. approximately 1 μm to approximately 200 μm, approximately 200 μm to approximately 400 μm, approximately 400 μm to approximately 600 μm, approximately 600 μm to approximately 800 μm, and approximately 800 μm to approximately 1000 μm.

Optionally, the definition layer 200 is formed to further include a bottom wall 220 connecting the plurality of lateral walls 210. In one example, the bottom wall 220 is in direct contact with the growth substrate 100. And the bottom wall 220 covers at least a portion of the growth substrate 100. The definition layer 200 has a simple structure, which may simplify the fabricating method of the definition layer 200.

Optionally, the definition layer is formed by insulating materials (e.g. Alumina), which will not affect the performance of the micro LEDs, and will protect the lateral walls of the micro LEDs.

Referring to FIG. 1, in some embodiments, the method of fabricating a micro LED display substrate further includes forming a plurality of semiconductor layers on the growth substrate. Optionally, forming the plurality of semiconductor layers on the growth substrate is performed subsequent to converting the remaining portion of the precursor material layer.

Figure 4:
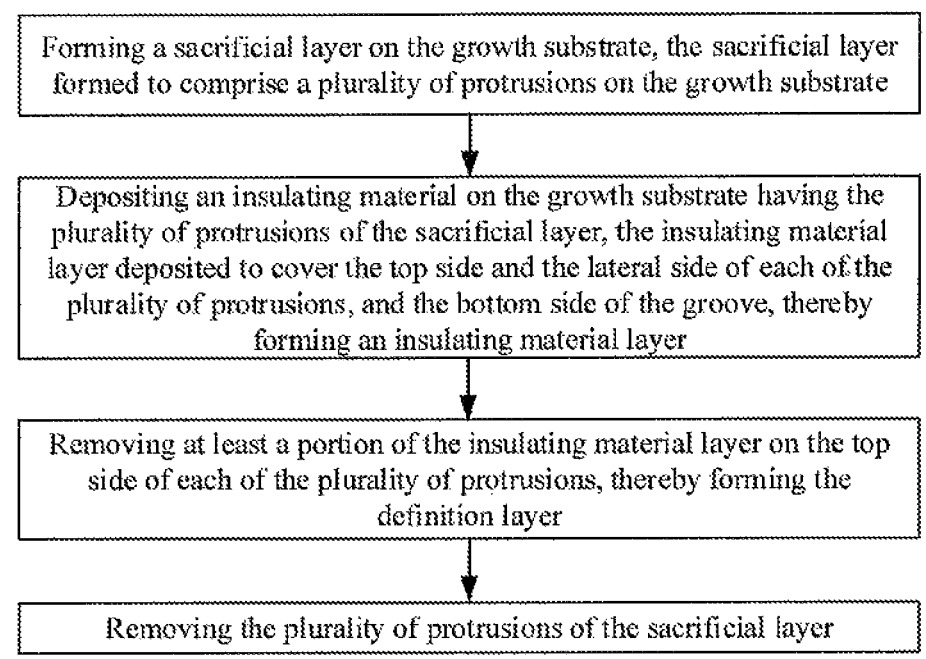
FIG. 4 is a flow chat illustrating a method of fabricating a micro LED display substrate in some embodiments according to the present disclosure.

FIG. 4 is a flow chat illustrating a method of fabricating a micro LED display substrate in some embodiments according to the present disclosure. Referring to FIG. 4, in some embodiments, forming the definition layer on the growth substrate includes forming a sacrificial layer on the growth substrate. Optionally, the sacrificial layer is formed to include a plurality of protrusions on the growth substrate. In some embodiments, subsequent to forming the sacrificial layer, an insulating material is deposited on the growth substrate having the plurality of protrusions of the sacrificial layer. Optionally, the insulating material layer is deposited to cover the top side of the lateral side of each of the plurality of protrusions, and the bottom side of the groove, thereby forming an insulating material layer. Subsequent to forming the insulating material layer, at least a portion of the insulating material layer is removed on the top side of each of the plurality of protrusions, thereby forming the definition layer. Subsequent to forming the definition layer, the plurality of protrusions of the sacrificial layer is removed.

Figure 5:
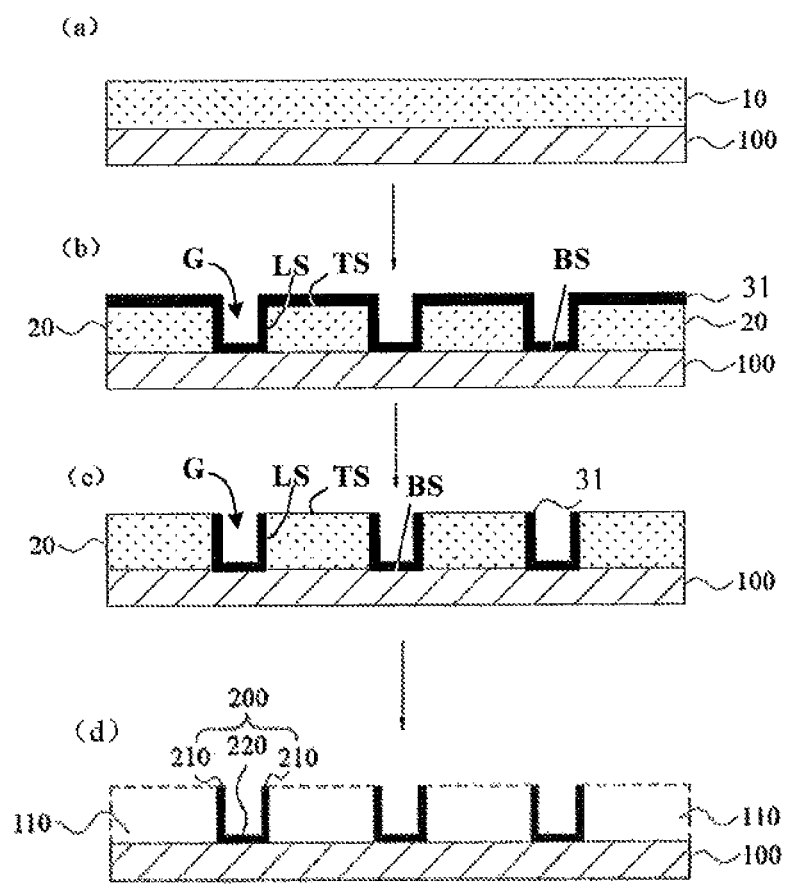
FIG. 5 is a flow chat illustrating a method of fabricating a micro LED display substrate in some embodiments according to the present disclosure.

FIG. 5 is a flow chat illustrating a method of fabricating a micro LED display substrate in some embodiments according to the present disclosure. Referring to FIG. 5(a), forming the definition layer on the growth substrate 100 includes forming a sacrificial layer 10 on a side of the growth substrate 100. Referring to FIG. 5(b), subsequent to forming the sacrificial layer 10, a patterning process is performed on the sacrificial layer 10 to form a plurality of protrusions 20. Optionally, each of the plurality of protrusions 20 is formed to have a top side TS away from the growth substrate 100 and a lateral side LS surrounding a perimeter of a respective one of the plurality of protrusions 20. Optionally, adjacent protrusions of the plurality of protrusions 20 are spaced apart by a groove G having a bottom side BS exposing a surface of the growth substrate 100.

Various appropriate methods may be used for patterning the sacrificial layer 10. Examples of methods suitable for patterning the sacrificial layer 10 include, not limited to, etching. Optionally, the pattern process is wet etching process.

Various appropriate materials may be used for making the sacrificial layer 10. Examples of materials suitable for making the sacrificial layer 10 include, but not limited to, materials having good solubility. In some embodiments, the material for making the sacrificial layer 10 is a material having a relatively high etching selectivity with respect to the other layers of the display substrate (e.g., the insulating material layer deposited on the plurality of protrusions 20). Optionally, the sacrificial layer 10 is formed using a material including a semiconductor material selected from a group consisting of a group III semiconductor material, a group IV semiconductor material, and a group V semiconductor material. The appropriate materials used for making the sacrificial layer 10 should be removed easily, so the plurality of protrusions 20 are easily removed to form the plurality of subpixel areas.

Referring to FIG. 5(b), in some embodiments, forming the definition layer further includes depositing an insulating material on the growth substrate 100 having the plurality of protrusions 20 of the sacrificial layer 10 to form an insulating material layer 31. Optionally, the insulating material layer 31 is deposited to cover the top side TS and the lateral side LS of each of the plurality of protrusions 20, and the bottom side BS of the groove G.

Various appropriate materials may be used for making the insulating material layer 31. Examples of materials suitable for making the insulating material layer 31 include, but not limited to, Alumina.

Referring to FIG. 5(c), in some embodiments, forming the definition layer further includes removing at least a portion of the insulating material layer 31 on the top side TS of each of the plurality of protrusions 20, thereby forming the definition layer 200. For example, a portion of the insulating material layer 31 on the top side TS of each of the plurality of protrusions 20 is removed to obtain a remaining portion of the insulating material layer 31 covering the lateral side LS of each of the plurality of protrusions 20 and the bottom side BS of the groove G.

Various appropriate methods may be used for removing at least a portion of the insulating material layer 31. Examples of methods suitable for removing at least a portion of the insulating material layer 31 include, but not limited to, mechanical grinding remove the insulating material layer 31 can be a simple process with low cost.

Subsequent to removing at least a portion of the insulating material layer 31, the definition layer 200 is formed on a side of the growth substrate 100 for defining a plurality of subpixel areas 110. The definition layer 200 includes a plurality of lateral walls 210 and a bottom wall 220. Optionally, the plurality of lateral walls 210 are perpendicular to the growth substrate 100. Optionally, each of the plurality of subpixel areas 110 is surrounded by a respective one of the plurality of lateral walls 210. Optionally, the plurality of subpixel areas 110 are arranged in array. In one example, the definition layer 200 may define the size of the micro LEDs, and can protect the sidewalls of the plurality of semiconductor layers of the micro LEDs from being damaged by etching process, which may avoid forming the leakage paths on the sidewalls of the plurality of semiconductor layers of the micro LEDs and improve the quality of the micro LEDs. The widths of the micro LEDs are in a range of approximately 1 μm to approximately 1000 μm, e.g. approximately 1 μm to approximately 200 μm, approximately 200 μm to approximately 400 μm, approximately 400 μm to approximately 600 μm, approximately 600 μm to approximately 800 μm, and approximately 800 μm to approximately 1000 μm.

Optionally, the definition layer 220 is formed to further include a bottom wall 220 connecting the plurality of lateral walls 210. In one example, the bottom wall 220 is in direct contact with the growth substrate 100. And the bottom wall 200 covers at least a portion of the growth substrate 100. The definition layer 200 has a simple structure, which may simplify the fabricating method of the definition layer 200.

Optionally, the definition layer is formed by insulating material, which will not affect the performance of the micro LEDs, and will protect the lateral walls of the micro LEDs.

Referring to FIG. 5(*d*), in some embodiments, subsequent to forming the definition layer 200, the plurality of protrusions 20 of the sacrificial layer 10 are removed. Various appropriate methods may be used for removing the plurality of protrusions 20. Examples of method suitable for removing the plurality of protrusions 20 include, but not limited to, dissolving materials having good solubility. For example, the methods for removing the plurality of protrusions 20 is dissolving the semiconductor material selected from a group consisting of a group III semiconductor material, a group IV semiconductor material, and a group V semiconductor material. It is also convenient to remove the plurality of protrusions 20 with simple procedures and low cost.

Referring to FIG. 1, in some embodiments, the method of fabricating a micro LED display substrate further includes forming a plurality of semiconductor layers on the growth substrate. Optionally, forming the plurality of semiconductor layers on the growth substrate is performed subsequent to removing the plurality of protrusions of the sacrificial layer.

Figure 6:
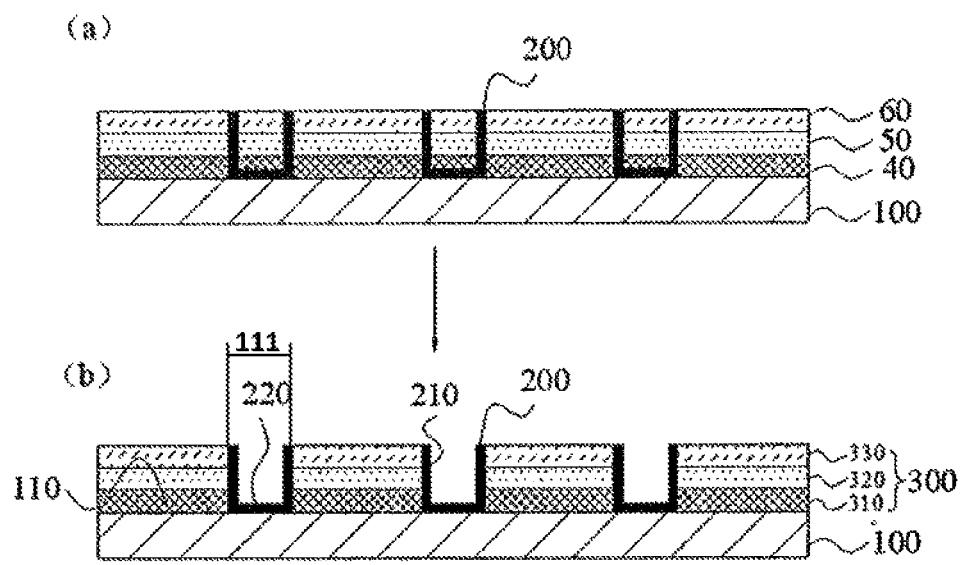
FIG. 6 illustrates a method of fabricating a micro LED display substrate in some embodiments according to the present disclosure.

FIG. 6 illustrates a method of fabricating a micro LED display substrate in some embodiments according to the present disclosure. Referring to FIG. 6(*b*), in some embodiments, the plurality of semiconductor layers 300 of micro LEDs include a first doped semiconductor layer 310, a light emitting layer 320, and a second doped semiconductor layer 330. Optionally, the first doped semiconductor layer 310, the light emitting layer 320, and the second doped semiconductor layer 330 are sequentially stacked. Optionally, the first doped semiconductor layer 310 is formed using a material selected from a group consisting of P-doped semiconductor materials and N-doped semiconductor materials. Optionally, the second doped semiconductor layer 330 is formed using a material selected from a group consisting of P-doped semiconductor materials and N-doped semiconductor materials. In one example, the P-doped semiconductor materials include p-GaN. In another example, the N-doped semiconductor materials include N—GaN. Optionally, the light emitting layer 320 includes multiple quantum wells (MQW). In one example, the light emitting layer 320 include a single layer having multiple quantum wells. In another example, the light emitting layer 320 includes multiple sublayers having multiple quantum wells. Optionally, the first doped semiconductor layer 310, the light emitting layer 320, and the second doped semiconductor layer 330 are independently formed by metal organic chemical vapor deposition.

In some embodiments, the plurality of semiconductor layers 300 of micro LEDs include the first doped semiconductor layer 310, and the second doped semiconductor layer 330. Optionally, the first doped semiconductor layer 310 and the second doped semiconductor layer 330 are sequentially stacked. Optionally, the first doped semiconductor layer 310 is formed using a material selected from a group consisting of P-doped semiconductor materials and N-doped semiconductor materials. Optionally, the second doped semiconductor layer 330 is formed using a material selected from a group consisting of P-doped semiconductor materials and N-doped semiconductor materials.

Referring to FIG. 6(*a*), in some embodiments, forming the plurality of semiconductor layers on the growth substrate includes forming a plurality of semiconductor material layers on the growth substrate in the plurality of subpixel areas and in an area between adjacent subpixel areas of the plurality of subpixel areas. Optionally, the semiconductor materials are deposited on the growth substrate 100 having the definition layer 200. Optionally, a first material 40 forming the first doped semiconductor layer 310, a second material 50 forming the multiple quantum wells 320, and a third material 60 forming the second doped semiconductor layer 330 are sequentially deposited on the growth substrate 100 having the definition layer 200.

Referring to FIG. 6(*b*), subsequent to depositing the semiconductor materials, the semiconductor materials in the area between adjacent subpixel areas 111 of the plurality of subpixel areas 110 are removed, thereby forming the plurality of semiconductor layers. For example, a mask is formed on regions corresponding to the plurality of subpixel areas 110, and a portion of the semiconductor material layers corresponding to areas between adjacent subpixel areas 111 of the plurality of subpixel areas 110 is uncovered by the mask. The portion of the semiconductor materials in the area between adjacent subpixel areas 111 of the plurality of subpixel areas 110 are removed, thereby forming the plurality of semiconductor layers 300 of the plurality of micro LEDs respectively in the plurality of subpixel areas. Optionally, the plurality of semiconductor layers 300 of the plurality of micro LEDs are respectively formed in the plurality of subpixel areas, and the plurality of semiconductor layers 300 of the plurality of micro LEDs are surrounded by the plurality of lateral walls 210 of the definition layer 200 respectively in the plurality of subpixel areas.

Various appropriate methods may be used for removing the portion of the semiconductor materials corresponding to areas between adjacent subpixel areas 111 of the plurality of subpixel areas 110. Examples of methods suitable for removing the semiconductor materials include, but not limited to, dry etching process. In one example, the semiconductor materials corresponding to areas between adjacent subpixel areas 111 of the plurality of subpixel areas 110 may be over-etched. For example, a portion of the bottom wall 220 of the definition layer 200 can be partially etched or even completely etched, as long as the plurality of lateral walls 210 of the definition layer 200 remain.

Referring to FIG. 1, in some embodiments, the method of fabricating a micro LED display substrate further includes transferring the plurality of semiconductor layers of the plurality of micro LEDs on the growth substrate onto a target substrate.

Figure 7:
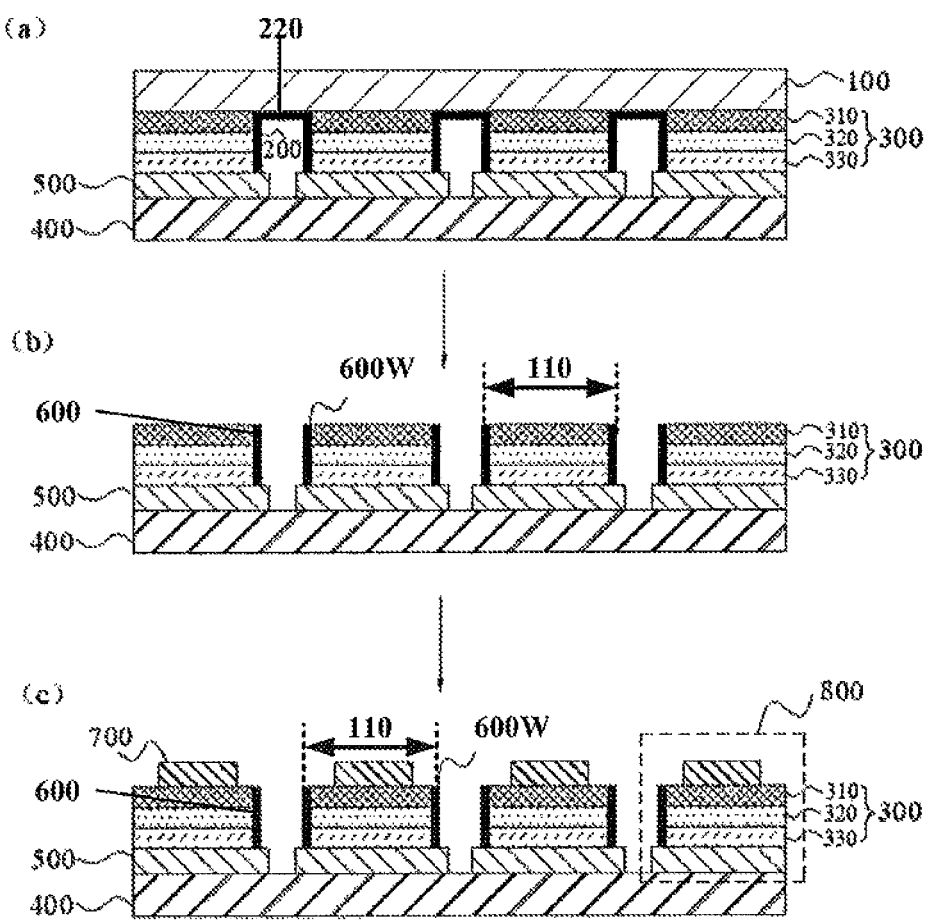
FIG. 7 illustrates a method of fabricating a micro LED display substrate in some embodiments according to the present disclosure.

FIG. 7 illustrates a method of fabricating a micro LED display substrate in some embodiments according to the present disclosure. Referring to FIG. 7(*a*), prior to transferring the plurality of semiconductor layers 300 of the plurality of micro LEDs onto the target substrate 400, a plurality of first electrodes 500 are formed on the target substrate 400. Subsequently, the plurality of semiconductor layers 300 of the plurality of micro LEDs are transferred to a side of the target substrate 400 having the plurality of first electrodes 500. The growth substrate 100 is opposite to the target substrate 400. The plurality of semiconductor layers 300 of the plurality of micro LEDs are respectively in directly contact with the plurality of first electrodes 500.

Optionally, the micro LED display substrate is integrated into a display apparatus, the target substrate 400 may be a driving substrate of an LED display apparatus. In one example, a plurality of thin film transistors (TFT) can be disposed on the target substrate 400 (e.g. driving substrate). The plurality of TFTs respectively corresponds to the plurality of first electrodes 500. For example, the plurality of s are respectively connected to the plurality of first electrodes 500. And the plurality of TFTs are configured to be switches of the plurality of micro LEDs.

Various appropriate types of TFT may be disposed on the target substrate 400. Examples of types of TFT suitable include, but not limited to top gate thin film transistors, and bottom gate thin film transistors. In one example, a top gate thin film transistor sequentially includes an active layer, a gating insulating layer, a gate, a dielectric inter-layer, a source electrode, a drain electrode, a passivation layer, and etc., to perform functions of the thin film transistor. For example, the active layer can be formed with metal oxide, or low temperature polysilicon.

Referring to FIG. 1, in some embodiments, the method of fabricating a micro LED display substrate further includes removing the growth substrate from the plurality of semiconductor layers of the plurality of micro LEDs transferred onto the target substrate, thereby forming the micro LED display substrate. Optionally, the bottom wall is removed subsequent to or simultaneously with removing the growth substrate.

Referring to FIGS. 7(*a*) and (*b*), the growth substrate 100 is removed. Optionally, the bottom wall 220 of the definition layer 200 is removed subsequent to or simultaneously with removing the growth substrate 100, thereby forming a pixel definition layer 600. Optionally, the pixel definition layer includes a plurality of lateral walls 600W. Optionally, each of the plurality of subpixel areas 110 is surrounded by a respective one of the plurality of lateral walls 600W. For example, the plurality of semiconductor layers surrounded by a respective one of the plurality of lateral walls of the pixel definition layer 600 in each of the plurality of subpixel areas 110 can independently emit light.

Optionally, the growth substrate 100 and the bottom wall of the definition layer 200 are removed using mechanical grinding, which is a simple process with low cost.

Referring to FIG. 7(*c*), a plurality of second electrodes 700 are respectively disposed on sides of the plurality of semiconductor layers 300 of the plurality of micro LEDs 800 away from the plurality of first electrodes 500 to form the micro LED display substrate.

The method of fabricating a micro LED display substrate disclosed herein is a simple way to fabricate micro LED display substrate with a high luminous efficiency. The method can further reduce the size of the micro LEDs 800 under the premise of ensuring the high luminous efficiency, which may improve the brightness of the micro LED display substrate. Reducing the size of the micro LEDs 800 can also increase the resolution of the micro LED display substrate.

Figure 8:
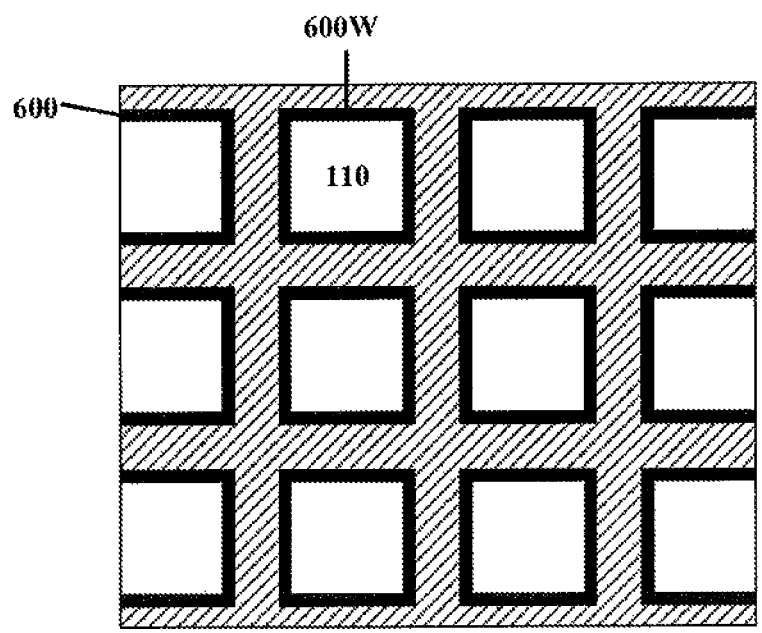
FIG. 8 is a plane view of the micro LED display substrate in some embodiments according to the present disclosure.

In another aspect, the present disclosure also provides a micro light emitting diode (micro LED) display substrate. FIG. 8 is a schematic diagram showing a plane view of the micro LED display substrate in some embodiments according to the present disclosure. Referring to FIG. 7(*c*) and FIG. 8, the micro LED display substrate includes a base substrate (e.g. the target substrate 400); and a pixel definition layer 600 on the base substrate. Optionally, the pixel definition layer 600 defines a plurality of subpixel areas 110. Optionally, the pixel definition layer 600 includes a plurality of lateral walls 600W. Optionally, at least one of the plurality of semiconductor layers in each individual one of the plurality of micro LEDs is surrounded by and in direct contact with a respectively one of the plurality of lateral walls 600W.

Referring to FIG. 7(*c*), A plurality of micro LEDs 800 are respectively in the plurality of subpixel areas 110. Optionally, each of the plurality of micro LEDs 800 includes a respective one of a plurality of first electrodes 500, a second doped semiconductor layer 330, a light emitting layer 320, a first doped semiconductor layer 310, and a respective one of a plurality of second electrodes 700 sequentially stacked together. For example, the plurality of first electrodes 500 are disposed on a side of the base substrate (e.g. the target substrate 400). The second doped semiconductor layer 330 is disposed on a side of the plurality of first electrodes 500 away from the based substrate (e.g. the target substrate 400). The light emitting layer 320 is disposed on a side of the second doped semiconductor layer 330 away from the base substrate (e.g. the target substrate 400). The first doped semiconductor layer 310 is disposed on a side of the light emitting layer 320 away from the base substrate (e.g. the target substrate 400). The plurality of second electrodes 700 are disposed on a side of the first doped semiconductor layer 310 away from the base substrate (e.g. the target substrate 400).

Optionally, the second doped semiconductor layer 330, the light emitting layer 320, and the first doped semiconductor layer 310 in each individual one of the plurality of micro LEDs are surrounded by and in direct contact with the respectively one of the plurality of lateral walls 600W of the pixel definition layer 600.

Optionally, the pixel definition layer 600 is between the plane containing the plurality of the first electrodes 500 and a plane containing the plurality of the second electrodes 700.

Optionally, the pixel definition layer 600 includes an insulating material. Optionally, the pixel definition layer 600 includes an insulating metal oxide material.

The micro LED display substrate disclosed herein has a high luminous efficiency, which may increase the brightness of the micro LED display panel. Also, the micro LED display substrate disclosed herein has a plurality of small size subpixels, which may increase the resolution of the micro LED display panel.

In another aspect, the present disclosure also provides a micro LED display panel containing the micro LED display substrate described herein.

In another aspect, the present disclosure also provides a micro LED display apparatus including the display panel described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A method of fabricating a micro light emitting diode (micro LED) display substrate, comprising:
    forming a definition layer on a growth substrate for defining a plurality of subpixel areas, the definition layer formed to comprise a plurality of lateral walls, each of the plurality of subpixel areas surrounded by a respective one of the plurality of lateral walls;
    forming a plurality of semiconductor layers of a plurality of micro LEDs on the growth substrate in the plurality of subpixel areas defined by the definition layer;
    transferring the plurality of semiconductor layers of the plurality of micro LEDs on the growth substrate onto a target substrate;
    removing the growth substrate from the plurality of semiconductor layers of the plurality of micro LEDs transferred onto the target substrate;
    wherein forming the definition layer comprises:
    forming a sacrificial layer on the growth substrate, the sacrificial layer formed to comprise a plurality of protrusions on the growth substrate;
    subsequent to forming the sacrificial layer having the plurality of protrusions on the growth substrate, depositing a precursor material on the growth substrate to form a precursor material layer covering the lateral side of each of the plurality of protrusions; and
    subsequent to forming the precursor material layer, removing the plurality of protrusions of the sacrificial layer.

2. The method of claim 1,
    wherein each of the plurality of protrusions is formed to have a top side away from the growth substrate and a lateral side surrounding a perimeter of a respective one of the plurality of protrusions; and
    adjacent protrusions of the plurality of protrusions are spaced apart by a groove having a bottom side exposing a surface of the growth substrate.

3. The method of claim 1, wherein the sacrificial layer is formed using a material comprising a semiconductor material selected from a group consisting of a group III semiconductor material, a group IV semiconductor material, and a group V semiconductor material.

4. The method of claim 1, wherein the precursor material layer is formed to cover the top side and the lateral side of each of the plurality of protrusions, and the bottom side of the groove; and
    forming the definition layer further comprises removing at least a portion of the precursor material layer on the top side of each of the plurality of protrusions.

5. The method of claim 4, wherein removing the at least the portion of the precursor material layer on the top side of each of the plurality of protrusions is performed by mechanical grinding.

6. The method of claim 1, wherein the precursor material comprises a metal.

7. The method of claim 1, subsequent to removing the plurality of protrusions of the sacrificial layer, further comprising converting a remaining portion of the precursor material layer into an insulating material, thereby forming the definition layer;
    wherein forming the plurality of semiconductor layers on the growth substrate is performed subsequent to converting the remaining portion of the precursor material layer.

8. The method of claim 7, wherein converting the remaining portion of the precursor material layer into the insulating material is performed by an annealing oxidation process.

9. The method of claim 7, wherein the definition layer comprises alumina.

10. A method of fabricating a micro light emitting diode (micro LED) display substrate, comprising:
    forming a definition layer on a growth substrate for defining a plurality of subpixel areas, the definition layer formed to comprise a plurality of lateral walls, each of the plurality of subpixel areas surrounded by a respective one of the plurality of lateral walls;
    forming a plurality of semiconductor layers of a plurality of micro LEDs on the growth substrate in the plurality of subpixel areas defined by the definition layer;
    transferring the plurality of semiconductor layers of the plurality of micro LEDs on the growth substrate onto a target substrate;
    removing the growth substrate from the plurality of semiconductor layers of the plurality of micro LEDs transferred onto the target substrate;
    wherein forming the definition layer further comprises:
    forming a sacrificial layer on the growth substrate, the sacrificial layer formed to comprise a plurality of protrusions on the growth substrate;
    subsequent to forming the sacrificial layer having the plurality of protrusions on the growth substrate, depositing an insulating material on the growth substrate, the insulating material deposited to cover the lateral side of each of the plurality of protrusions, thereby forming an insulating material layer;
    subsequent to forming the insulating material layer, removing the plurality of protrusions of the sacrificial layer;
    wherein forming the plurality of semiconductor layers on the growth substrate is performed subsequent to removing the plurality of protrusions of the sacrificial layer.

11. The method of claim 10, wherein the insulating material is deposited to cover the top side and the lateral side of each of the plurality of protrusions, and the bottom side of the groove; and
    forming the definition layer further comprises removing at least a portion of the insulating material layer on the top side of each of the plurality of protrusions, thereby forming the definition layer.

12. The method of claim 1, wherein the definition layer is formed to further comprise a bottom wall connecting the plurality of lateral walls, the bottom wall being in direct contact with the growth substrate; and the method further comprises removing the bottom wall subsequent to or simultaneously with removing the growth substrate.

13. The method of claim 1, wherein forming the plurality of semiconductor layers on the growth substrate comprises:

forming a plurality of semiconductor material layers on the growth substrate in the plurality of subpixel areas and in an area between adjacent subpixel areas of the plurality of subpixel areas; and removing semiconductor materials in the area between adjacent subpixel areas of the plurality of subpixel areas, thereby forming the plurality of semiconductor layers.

14. The method of claim 10, wherein each of the plurality of protrusions is formed to have a top side away from the growth substrate and a lateral side surrounding a perimeter of a respective one of the plurality of protrusions; and adjacent protrusions of the plurality of protrusions are spaced apart by a groove having a bottom side exposing a surface of the growth substrate.

15. The method of claim 10, wherein the sacrificial layer is formed using a material comprising a semiconductor material selected from a group consisting of a group III semiconductor material, a group IV semiconductor material, and a group V semiconductor material.

16. The method of claim 10, wherein the definition layer is formed to further comprise a bottom wall connecting the plurality of lateral walls, the bottom wall being in direct contact with the growth substrate; and the method further comprises removing the bottom wall subsequent to or simultaneously with removing the growth substrate.

17. The method of claim 10, wherein forming the plurality of semiconductor layers on the growth substrate comprises:

forming a plurality of semiconductor material layers on the growth substrate in the plurality of subpixel areas and in an area between adjacent subpixel areas of the plurality of subpixel areas; and removing semiconductor materials in the area between adjacent subpixel areas of the plurality of subpixel areas, thereby forming the plurality of semiconductor layers.

* * * * *